(12) United States Patent
Montanini et al.

(10) Patent No.: US 8,476,143 B2
(45) Date of Patent: Jul. 2, 2013

(54) DEEP CONTACTS OF INTEGRATED ELECTRONIC DEVICES BASED ON REGIONS IMPLANTED THROUGH TRENCHES

(75) Inventors: Pietro Montanini, Milan (IT); Marta Mottura, Milan (IT); Giuseppe Croce, Monticello B. (IT)

(73) Assignee: STMicroelectonics S.r.L., Agrate Brianza (IT)

( * ) Notice: Subject to any disclaimer, the term of this patent is extended or adjusted under 35 U.S.C. 154(b) by 0 days.

(21) Appl. No.: 13/349,416

(22) Filed: Jan. 12, 2012

(65) Prior Publication Data

US 2013/0017676 A1    Jan. 17, 2013

Related U.S. Application Data

(62) Division of application No. 12/335,285, filed on Dec. 15, 2008, now Pat. No. 8,115,314.

(30) Foreign Application Priority Data

Dec. 14, 2007  (IT) .............................. MI2007A2341

(51) Int. Cl.
    *H01L 21/76* (2006.01)
(52) U.S. Cl.
    USPC .................................. 438/434; 257/E21.546
(58) Field of Classification Search
    USPC .................................. 438/434; 257/E21.546
    See application file for complete search history.

(56) References Cited

U.S. PATENT DOCUMENTS

| 4,939,567 | A | 7/1990 | Kenney |
| 5,188,971 | A | 2/1993 | Pollock et al. |
| 5,488,236 | A | 1/1996 | Baliga et al. |
| 5,889,314 | A | 3/1999 | Hirabayashi |
| 5,891,776 | A | 4/1999 | Han et al. |
| 6,326,283 | B1 | 12/2001 | Liang et al. |
| 6,445,044 | B2 | 9/2002 | Manning |
| 6,469,366 | B1 | 10/2002 | Nakashima et al. |
| 6,576,516 | B1 | 6/2003 | Blanchard |
| 6,870,222 | B2 * | 3/2005 | Kim et al. ..................... 257/343 |
| 6,943,426 | B2 | 9/2005 | Williams et al. |
| 6,956,266 | B1 | 10/2005 | Voldman et al. |
| 7,411,271 | B1 | 8/2008 | Ma et al. |

(Continued)

OTHER PUBLICATIONS

Lorenzo Cerati, Luca Cecchetto, Mariano Dissegna, Antonio Andreini, Giulio Ricotti, "Novel Technique to Reduce Latch-up Risk due to ESD Protection Devices in Smart Power Technologies", Proceeding of 2006 EOS/ESD Symposium, Tucson, vol. 1B.1, pp. 32-38.

(Continued)

*Primary Examiner* — Lex Malsawma
(74) *Attorney, Agent, or Firm* — Graybeal Jackson LLP

(57) ABSTRACT

An embodiment of an integrated circuit includes first and second semiconductor layers and a contact region disposed in the second layer. The first semiconductor layer is of a first conductivity, and the second semiconductor layer is disposed over the first layer and has a surface. The contact region is contiguous with the surface, contacts the first layer, includes a first inner conductive portion, and includes an outer conductive portion of the first conductivity. The contact region may extend deeper than conventional contact regions, because where the inner conductive portion is formed from a trench, doping the outer conductive portion via the trench may allow one to implant the dopants more deeply than conventional techniques allow.

20 Claims, 10 Drawing Sheets

U.S. PATENT DOCUMENTS

| | | |
|---|---|---|
| 2002/0003250 A1 | 1/2002 | Werner |
| 2002/0053699 A1 | 5/2002 | Kim et al. |
| 2002/0096748 A1 | 7/2002 | Pavier |
| 2005/0181558 A1* | 8/2005 | Hshieh .................. 438/248 |
| 2007/0034944 A1 | 2/2007 | Xu et al. |
| 2007/0181972 A1 | 8/2007 | Voldman |
| 2008/0128828 A1 | 6/2008 | Nakamura |
| 2008/0211064 A1 | 9/2008 | Orner et al. |

OTHER PUBLICATIONS

R. Stella, S. Favilla and G. Croce, "Novel achievements in the understanding and suppression of parasitic minority carrier currents in P-epitaxy/P++ substrate Smart Power Technologies", Proceeding of 2004 International Symposium on Power Semiconductor Device & ICs, Kitakyushu, pp. 423-426.

* cited by examiner

DEEP CONTACTS OF INTEGRATED ELECTRONIC DEVICES BASED ON REGIONS IMPLANTED THROUGH TRENCHES

RELATED APPLICATION DATA

The present application is a Divisional of U.S. patent application Ser. No. 12/335,285, filed Dec. 15, 2008, now U.S. Pat. No. 8,115,314 issued Feb. 14, 2012; which application claims priority to Italian Patent Application No. MI2007A0002341, filed Dec. 14, 2007; all of the foregoing applications are incorporated herein by reference in their entireties.

PRIORITY CLAIM

The present application is related to U.S. patent application Ser. No. 12/335,178 entitled DEEP GUARD REGIONS FOR REDUCING LATCH-UP IN ELECTRONICS DEVICES filed Dec. 15, 2008, and which is incorporated herein by reference in its entirety.

TECHNICAL FIELD

An embodiment of the present invention relates to the electronics field. Particularly, an embodiment of the present invention relates to contact elements of integrated electronic devices; more particularly, these elements are used to contact covered layers of the electronic devices (such as substrates or buried layers).

BACKGROUND

Electronic devices are generally integrated in a composite chip of semiconductor material; the chip includes a substrate defining a mechanical support for an active layer (typically including one or more epitaxial layers), which active layer houses different electronic components of the device (such as MOSFET transistors); sometimes, one or more (highly doped) buried layers are also enclosed between the substrate and the active layer, or within the active layer (between a pair of adjacent epitaxial layers).

Usually, it is desired to contact the substrate or the buried layers (hereinafter generically denoted as covered layers) with a very low resistance path, in order to collect undesired or functional currents that are injected into them by the electronic components of the device during its operation. Indeed, the undesired currents can adversely affect the device or even destroy it if not suitably discharged; on the other hand, the functional currents would generate large voltage drop and power dissipation if collected through a too high resistance path.

For this purpose, front-side deep contact elements (or simply deep contacts), also referred to as sinkers, may be used. Each deep contact includes a low resistance region (of the same type of conductivity of the covered layer), which extends in the active layer from a front surface of the chip down to the covered layer. For example, these deep contacts are required when it is not possible to collect the currents being injected towards the substrate directly through a back-side contact—such as when the device has a poor backside contact or it is assembled with a flip-chip technique.

Alternatively, the same deep contacts may be exploited to insulate corresponding wells of the active layer. In this case, the active layer is of the opposite type of conductivity of the substrate; each deep contact includes a frame of the same type of conductivity of the substrate, which surrounds the well down to the substrate (so as to define an insulation region for the well). As a result, it is possible to insulate the well from the rest of the chip when a P-N junction formed between the insulation region and the well is reverse biased.

Particularly, in medium or high-voltage applications (typically working at 40-150 V and 150-1,000 V, respectively), the active layer is relatively thick (such as 8-12 μm); for example, this is required to implement vertical power components (such as MOS transistors with full vertical gate and current collection structure or with vertical current collection and lateral gate structure). Therefore, in order to reach the covered layer the deep contacts extend very far away from the front surface of the chip.

The above-mentioned deep contacts are obtained by diffusing (i.e., driving-in) doping impurities, or dopant—of the same type of conductivity of the covered layer—within the active layer up to reach the covered layer. Alternatively, it is possible to diffuse doping impurities previously implanted within the covered layer before the formation of the active layer.

A drawback of the solution described above is that the deep contacts so obtained waste a significant area of the device. Indeed, each diffused region has a width (parallel to the front surface of the chip), which increases with its depth, since the doping impurities diffuse approximately uniformly in every direction.

Moreover, in smart power applications the same device also comprises other components, such as logic circuits controlling the power components (for example, a microprocessor and a digital signal processor), a memory module, power supply management circuits and circuits that enable the communication of the device with the outside. All the components of these devices may be manufactured by means of so-called "cold" processes, wherein the doped regions exploited for implementing the electronic components are formed without any diffusion of the doping impurities in the active layer; conversely, short thermal processes (such as annealing processes) are used for activating the doping impurities, which have been previously implanted. However, the cold processes only allow obtaining regions with reduced depths (at most of 4 μm); therefore, they are often unsuitable to form the required deep contacts, which should reach covered layers more far away from the front surface of the chip (such as 8-12 μm).

Different techniques for forming generic low resistance paths are also known in the art.

For example, U.S. Pat. No. 5,188,971, which is incorporated by reference, discloses a sinker, which is self-aligned with an insulating trench of a bipolar device. The sinker includes a heavily doped region used for connecting a collector region of the transistor to the substrate. In order to form the sinker, doping impurities are diffused around a region where the trench is partially formed; the trench is then completely etched down to the substrate and it is finally filled with insulating material (such as silicon oxide).

U.S. Pat. No. 4,939,567, which is incorporated by reference, discloses a horizontal contact between a P-type diffused region and an N-type diffused region implementing a source region of a P-MOS transistor and a drain region of an N-MOS transistor, respectively (for a SRAM memory cell). The horizontal contact includes a trench arranged between the two diffused regions; the trench is coated with a thin conforming insulating layer and then filled with conductive material, which electrically couples the two regions.

U.S. Pat. No. 5,891,776, which is incorporated by reference, discloses a method to form an IGBT (Insulated Gate Bipolar Transistor). In particular, the formation of the doped regions (being exploited for implementing the IGBT) is achieved by depositing or implanting doping impurities through a trench extending into a stack of semiconductor layers and then diffusing the doping impurities into the semiconductor region surrounding the trench. The trench is now covered with an insulating layer, and it is filled with conductive material (such as aluminum).

More generally, the trenches are also used in different applications.

For example, U.S. Pat. No. 5,488,236, which is incorporated by reference, discloses a gate controlled bipolar transistor with a gate electrode that is formed in a trench.

Finally, in U.S. Pat. No. 6,956,266, which is incorporated by reference, the trenches, which are coated with an insulating conforming layer and filled with polysilicon, are used for suppressing the latch-up in integrated circuits.

SUMMARY

In principle, the present disclosure is based on the idea of using one or more trenches for implanting doping impurities deeply.

In detail, an embodiment of the present invention is a method for manufacturing an integrated electronic device. The method starts with the step of providing a chip of semiconductor material, which includes a covered layer (such as a substrate or a buried layer) and an active layer (such as one or more epitaxial layers) that is stacked on the covered layer; the active layer has an exposed (or front) surface opposite the covered layer; a contact element is then formed for electrically contacting the covered layer from the exposed surface (such as for collecting undesired or functional currents, or for insulating a corresponding well of the active layer). The step of forming the contact element includes forming at least one trench, which extends from the exposed surface into the active layer (with each trench that has a lateral surface and a bottom surface). Doping impurities are implanted into the chip through the lateral surface of each trench (or a part thereof). Each trench is then filled with conductive material. The implanted doping impurities are now activated, so as to obtain at least one contact region that extends from the exposed surface to the covered layer.

An embodiment includes forming two or more trenches, which are surrounded by a single contact region.

In this case, a suggested layout of the trenches is proposed.

In an embodiment of the present invention, the doping impurities are also implanted through the bottom surface of each trench.

In this case, it is possible to have each trench that is less depth that a thickness of the active layer.

An implantation of the doping impurities is obtained by means of one or more beams that are inclined with respect to an axis of each trench.

Suggested temperatures and periods for activating the implanted doping impurities are proposed.

The depth of each trench may be higher than its width.

Values of a form ratio of each trench are also recommended.

In an embodiment of the invention, the dopant concentration is lower in the conductive material than it is in the contact regions(s).

Particularly, the conductive material may be polysilicon being doped in situ.

Moreover, an embodiment may include forming one or more interconnection taps contacting the filled trenches.

Power components may be integrated in the active layer.

The step of activating the doping impurities may be performed at the same time for the power components and the contact element.

Particularly, a logic circuit as well may be integrated in the active layer.

In an embodiment of the invention, the contact element includes a sinker for collecting an undesired current from a substrate of the chip.

In a further embodiment of the invention, the contact element includes a sinker for collecting a functional current from a buried layer of the chip.

In a still further embodiment of the invention, the contact element forms an insulating region with a substrate of the chip (for insulating a corresponding well of the active layer).

Another embodiment of the present invention provides a corresponding integrated electronic device.

BRIEF DESCRIPTION OF THE DRAWINGS

Features and the advantages of one or more embodiments will be best understood by reference to the following detailed description, given purely by way of a non-restrictive indication, to be read in conjunction with the accompanying drawings. In this respect, it is expressly intended that the figures are not necessary drawn to scale and that, unless otherwise indicated, they are merely intended to conceptually illustrate the structures and procedures described herein. Particularly.

DETAILED DESCRIPTION

Figure 1:
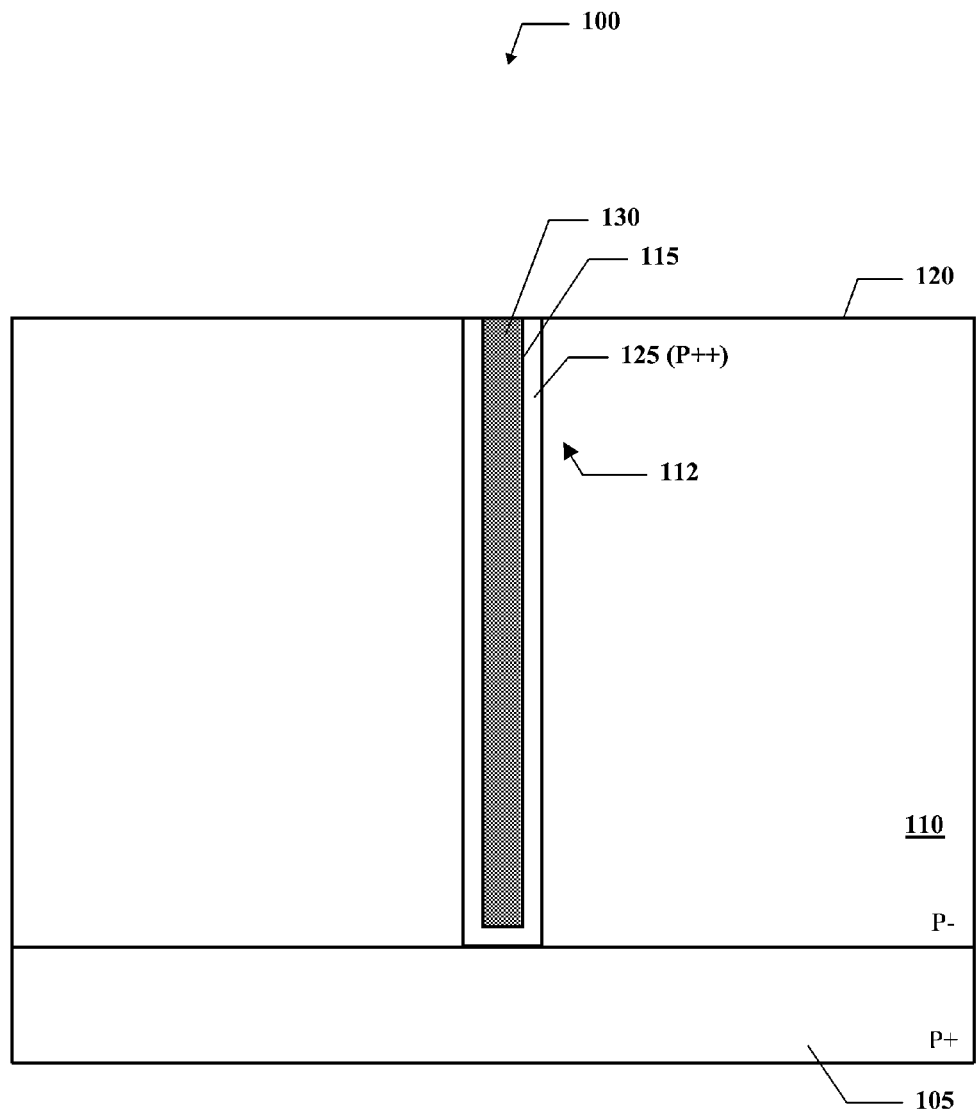
FIG. 1 shows a cross-section view of a schematic structure of an electronic device according to an embodiment of the present invention.

With reference now to the figures, FIG. 1 shows a cross-section view of an electronic device 100. As usual, the concentrations of N-type and P-type doping impurities are denoted by adding the sign + or the sign − to the letters N and P to indicate a high or low concentration of impurities, respectively, or the sign ++ or the sign −− to indicate a very high or a very low concentration of impurities, respectively; the letters N and P without the addition of any sign + or − denote concentrations of intermediate value.

In particular, the device 100 (for example, of the smart power type) is formed in a chip including a semiconductor substrate 105 (for example, of the P+ type of conductivity). The electronic components of the device 100—either of the power type or of the logic type (not shown in the figure)—are integrated in a semiconductor active layer 110 (for example, of the P− type), which is stacked on the substrate 105.

The device 100 includes a deep contact 112 extending through the active layer 110 down to the substrate 105; this deep contact 112 is used to collect undesired currents that are injected by the electronic components towards the substrate 105 (and towards the active layer 110 as well).

According to an embodiment of the present invention, as described in detail in the following, the deep contact 112 is formed by exploiting one or more trenches 115 (only one shown in figure) extending into the active layer 110 from an exposed (or front) surface 120 thereof (opposite the substrate 105).

For this purpose, doping impurities are implanted (and then activated) into the chip through at least part of the lateral surfaces of the trench 115 (which is then filled with conductive material 130). As a result, a highly doped contact region 125 (for example, of the P++ type) extending from the front surface 120 to the substrate 105 is obtained.

In such a way, the doping impurities are placed deeply in the desired region of the active layer 110, so that no diffusion of the doping impurities is need.

An embodiment allows increasing the depth of the deep contact 112 (up to reaching the substrate 105) at the same time maintaining a reduced area on the front surface 120. The trench 115 is primarily used to implant the doping impurities deeply, and only secondarily as a low resistance connection; as a result, its size can be maintained as small as possible (just enough to form the desired contact region 125, which mainly defines the desired low resistance path).

All of the above may have a beneficial impact on the size of the whole device 100.

Referring now to FIGS. 2A through 2G, an embodiment of a process for manufacturing the proposed device will be explained in detail.

Figure 2A:
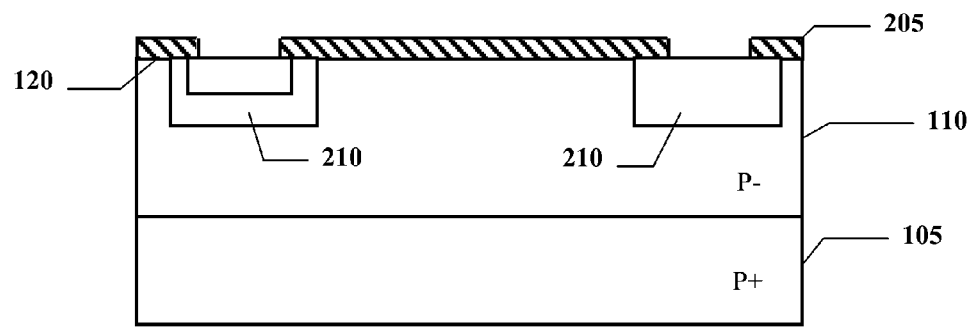
FIGS. 2A through 2G are cross-section views illustrating the main phases of the manufacturing process of an integrated electronic device, according to an embodiment of the present invention.

Considering in particular FIG. 2A, the starting material is a wafer including the semiconductor substrate 105 (wherein a plurality of identical chips will be formed). For example, the substrate 105 (of the P+ type) has a dopant concentration ranging from $5*10^{18}$ to $5*10^{19}$ ions/cm$^3$. Moreover, the chip includes the active layer 110 of the P– type, which is generally formed by one or more epitaxial layers; in the example at issue, the active layer 110 has a dopant concentration ranging from approximately $10^{15}$ ions/cm$^3$ to $10^{16}$ ions/cm$^3$. Typically, the substrate 105 has a thickness ranging from about 4 µm to 8 µm, for example from 5 µm to 7 µm (such as 6 µm); in power applications at medium voltage (such as, 20-50V) with both high side and low side devices and low injection toward the substrate, the active layer 110 instead has a larger thickness, for example, ranging from about 5 µm to 20 µm, for example from 7 µm to 19 µm (such as 17 µm).

An isolation layer 205 (for example, of field oxide) is formed on each chip in order to cover the front surface 120 except for a portion thereof where functional regions 210 of the desired electronic components are defined (by implanting doping impurities into the active layer 110). In particular, the isolation layer 205 may be obtained by means of the conventional LOCOS (Local Oxidation of Silicon) techniques; alternatively, other techniques—such as the STI (Shallow Trench Isolation) techniques—may be used.

Figure 2B:
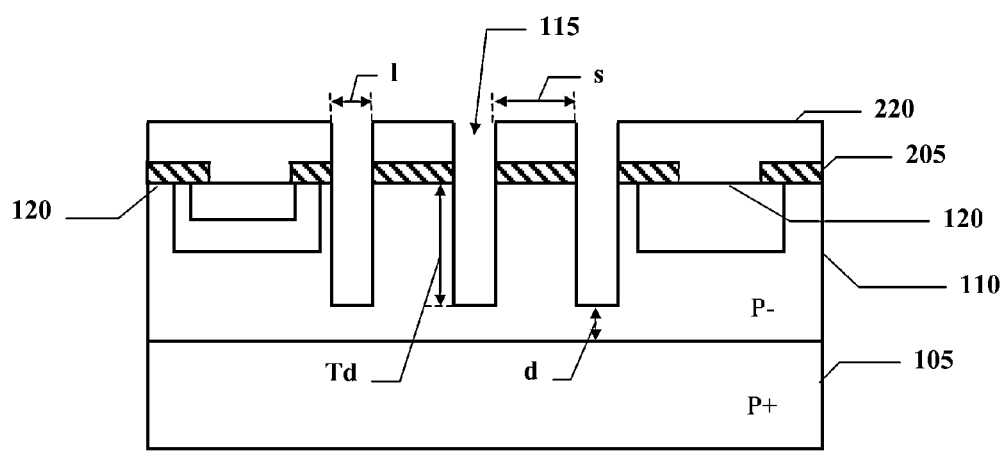

Moving to FIG. 2B, multiple trenches 115 are formed, by selectively etching the isolation layer 205 and the active layer 110; for example, the figure shows three trenches 115 (each one with a square cross-section perpendicularly to its longitudinal axis). In order to form the trenches 115, a photoresist or hard mask 220 is provided on top of the isolation layer 205 and the free portion of the front surface 120, so as to leave exposed areas thereof where the trenches 115 are desired. Alternatively, the same trenches may also be formed by operating directly on the active layer 110 (without any field oxide layer).

In the example at issue, a trench depth Td (measured from the front surface 120) may be lower than the thickness of the active layer 110. In particular, the trench depth Td ranges from about 5 µm to 17 µm (such as 5 µm for an active layer 110 of 6 µm, or 15 µm for an active layer 110 of 17 µm). In this way, the trenches 115 do not reach the substrate 105, but they rest at a distance d from the substrate 105 equal to the difference between the thickness of the active layer 110 and the trench depth Td (a few µm in the example at issue). This allows maintaining the size of the trenches 115 as small as possible; at the same time, the resulting contact region (being formed both around and below the trenches 115) may be exploited. Moreover, this allows avoiding any etching in the (heavily doped) substrate 105, so as to minimize the introduction of any collateral defects. In some applications (such as when the trenches 115 are used for insulation purposes), a junction between each insulated well and the corresponding trench 115 is formed close to its lateral surface; in this case, a very regular crystalline structure may be maintained near the surface. Therefore, any crystal damaging is recovered (before the next implantation process) by a $H_2$ Rapid Thermal Process annealing procedure at a temperature ranging from 900° C. to 1,100° C. for 1-5 min. (by using a suitable $H_2$ furnace).

The trenches 115 are very narrow and deep. A form ratio between the trench depth Td and a trench width I (defined by the side of its squared cross-section in the example at issue) may range from about 2 to 40, for example from 10 to 30 (such as 20). For example, the trench width I ranges from about 0.2 µm to 2 µm, for example from 0.5 µm to 1.8 µm (such as 0.8 µm). Typically, each trench 115 is spaced apart from any adjacent trench 115 by a distance s—measured between their lateral surfaces—which may range from about 0.5 µm to 1.5 µm, for example from 0.9 µm to 1.1 µm (such as 1 µm). This layout of the trenches 115 has been found to provide excellent results (in terms of the lowering of the contact resistance and the contact size), while keeping the process complexity (in term of morphological structures) in a safe region.

Figure 2C:
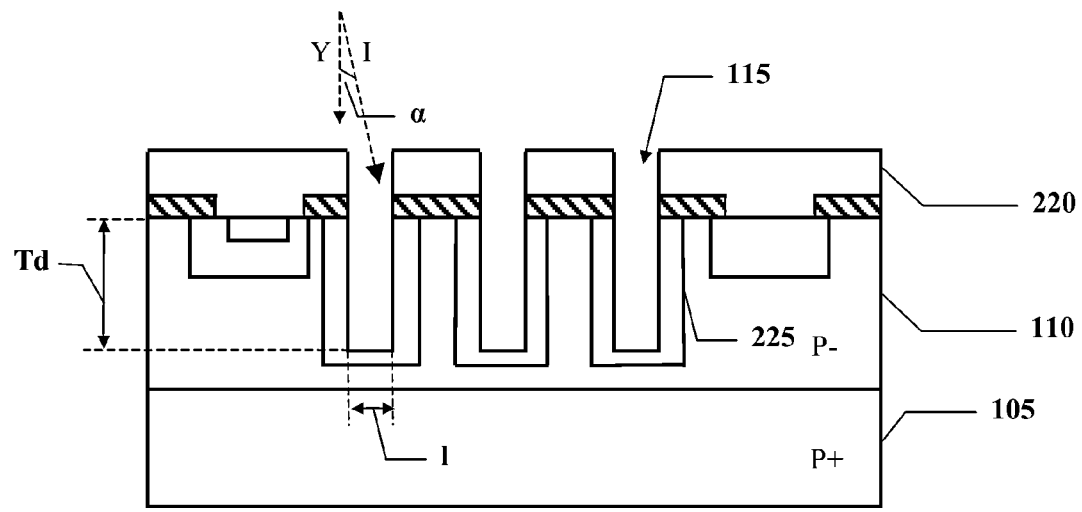

As shown in FIG. 2C, an implantation of doping impurities is performed in order to form (within the active layer 110) highly doped regions 225, which are adjacent to the corresponding trenches 115. Such implantation process uses the mask 220 in order to have the regions 225 in areas corresponding to the trenches 115. The regions 225 have the same type of conductivity of the substrate 105. For example, in order to form regions 225 of the P++ type, Boron (B) ions may be used; the dose of the doping impurities may range from $5*10^{15}$ Atoms/cm$^2$ to $10^{16}$ Atoms/cm$^2$, with an implanting energy lower than 50 KeV, such as 25 KeV.

A desired result may be achieved by multiple implantation processes along different directions, in order to cause the doping impurities to penetrate into the whole active layer 110 surrounding each trench 115. Particularly, at least two implantation processes may be performed along directions that are symmetric with respect to a vertical direction Y (parallel to the longitudinal axes of the trenches 115). In this way, the doping impurities are implanted through a portion of a lateral surface of the trenches 115 at each iteration of the implantation process (so as to reach a corresponding region of the active layer 110 around the trenches 115). A further implantation process is performed substantially along the vertical direction Y; in this way, the doping impurities are implanted through a bottom surface of the trenches 115 (so as to reach a region of the active layer 110 below the trenches 115).

In particular, each one of the (lateral) implantation processes involves the use of a beam of doping impurities propagating along a direction I having a corresponding tilt α with respect to the vertical direction Y. In an embodiment, the tilt α should not exceed an arctg function of a ratio between the trench width I and the trench depth Td—α<=arctg(I/Td). This allows having the implanted doping impurities reach completely the lateral surface of each trench 115 without leaving non-doped semiconductor regions (thereby avoiding a so-called shadow-effect). Typically, the tilt α ranges from about 0.5° to 3.15°, for example from 0.6° to 3.10° (such as α=3°). Conversely, during the (bottom) implantation process the tilt α may be substantially 0°. For example, during a first implantation process, the wafer is inclined with respect to a direction of the doping impurities beam at an angle α=3°, whereas during a second implantation process the wafer is inclined at the opposite angle α=-3°, and finally during a third implantation process the wafer is not inclined (α=) 0°. In this case, it is possible to obtain trenches 115 with a form ratio up to) Td/I<=1/tg(α)=1/tg(3°)=19.08.

Figure 2D:
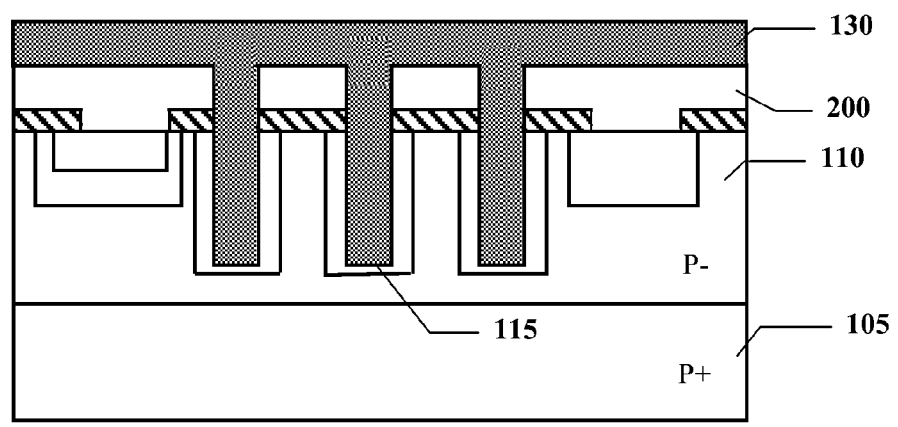

Referring to FIG. 2D, a layer of conductive material 130 is deposited so as to completely fill the trenches 115.

In an embodiment of the present invention, the conductive material layer 130 comprises a polysilicon layer being doped with impurities of the P+ type. In particular, the doped polysilicon layer may be obtained by forming a polysilicon layer doped in situ with diborane ($B_2H_6$)—for example, by means of Low-Pressure Chemical Vapor Deposition.

Figure 2E:
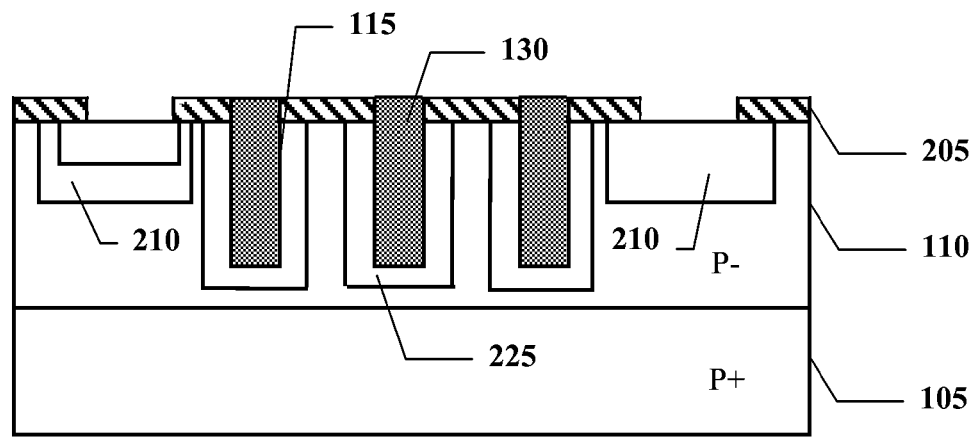

As shown in FIG. 2E, the excess conductive material 130 is removed so as to become flush with the isolation layer 205. For example, this result may be achieved by means of the CMP (Chemical Mechanical Polishing) technique, in case the free surface of the conductive material 130 exhibits negligible roughness (for example, lower than 100 nm). Vice versa, in case the free surface of the conductive material 130 exhibits significant roughness (such as higher than 100 nm), a rough etching of the conductive material 130 may be previously performed (providing, on the filled trenches 115, an additional mask adapted to protect them from this etching process). In any case, the mask 220 (See FIG. 2D)—together with the above-mentioned additional mask when present—is then stripped away.

The chip is now subjected to a thermal activation process at a temperature that may range from about 950° C. to 1,050° C., for example from 980° C. to 1,030° C. (for example, 1,000° C.); the activation process lasts for a period that may range from about 30 s to 300 s, for example from 60 s to 120 s (for example, 90 s). During this phase, the chip is heated shortly (for example, by means of a Rapid Thermal Process or of a Rapid Thermal Annealing) up to the activation temperature and subsequently cooled slowly. This process is used for activating the doping impurities previously implanted both in the functional regions 210 (used for implementing the electronic components of the device) and in the regions 225 (used for implementing the deep contact). This process allows obtaining deep diffusion in a small area with very low thermal budget; however, the use of a conventional furnace activation is not excluded.

Figure 2F:
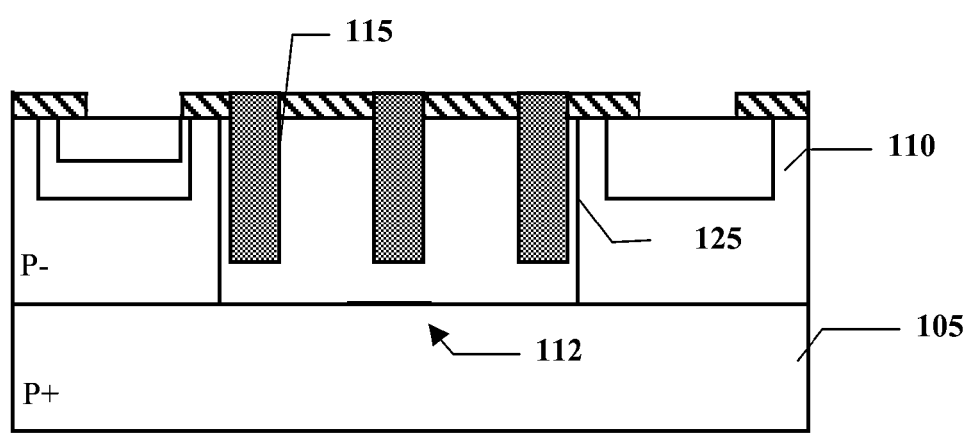

As shown in FIG. 2F, this activation process results in the generation of the desired contact region 125. As can be seen, the (activated) doping impurities reach the substrate 105 thanks to their deep implantation through the trenches 115 (even if no diffusion is performed). Particularly, the doping impurities associated with the different trenches 115 enters in contact so as to form a single contact region 125 (extending from the front surface 120), which embeds all the filled trenches 115 and reaches the substrate 105. This configuration provides good performance of the resulting deep contact 112 (in terms of the lowering of its resistance and size). In particular, the use of multiple filled trenches 115 reduces the resistance of the deep contact 112 (for the same size); indeed, in this case it is possible to implant more doping impurities so as to obtain a larger contact region (more conductive than the filled trenches).

Figure 2G:
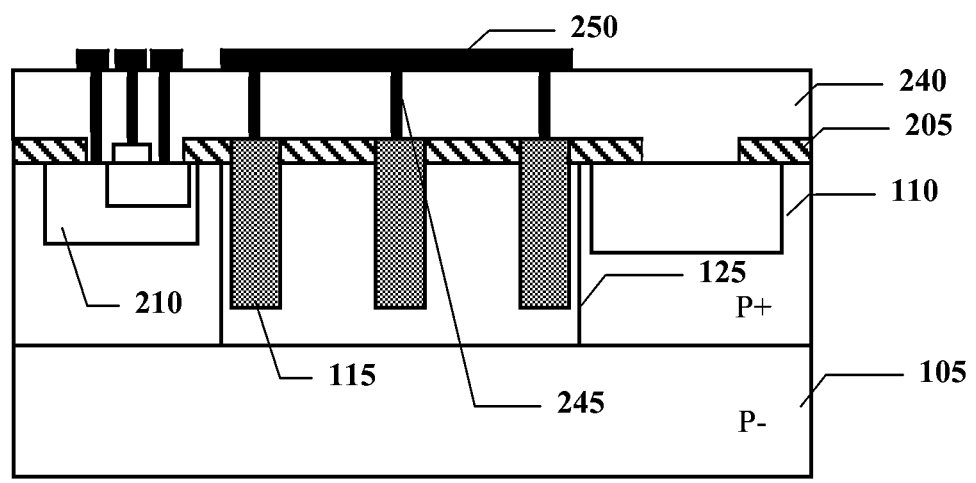

Moving to FIG. 2G, a dielectric layer 240 (for example, of silicon oxide nitride) is deposited on top of the isolation layer 205 and on the free surface of the filled trenches 115 (for example, by means of a CVD process). A plurality of contact windows 245 is etched in the dielectric layer 240 so as to reach the filled trenches 115 (at the same time, other windows are opened to reach the functional regions 210 of the electronic components that are integrated in the chip).

Afterwards, a metallization layer 250 (for example, Al or Ti/TiN plus a W-plug and an Al layer) is deposited on top of the chip, thereby filling the contact windows 245. The metallization layer 250 is then shaped to define an interconnection tap (such as, a pad), which contacts the filled trenches 115; at the same time, other interconnection taps are formed to contact the functional regions 210 of the electronic components. In this way, no further etching is required through the isolation layer 205 (since the filled trenches 115 are already exposed).

The electrical characteristics of the deep contact so obtained depend on its structure. In particular, the resistance (R) of a deep contact comprising a matrix of filled trenches depends on the number of the filled trenches ($N_D$), on a width of the contact region (L), and on a resistivity $\rho_u$ of the filled trenches (in the example at issue, approximately equal to $10^6$ mΩμm). In detail:

$$R=\rho_u/N_D*L$$

For example, in a deep contact with a square shape having a side approximately equal to 100 μm, wherein each row and each column comprises approximately 50 filled trenches, the resistance is approximately equal to 200 mΩ.

Advantages of an embodiment are confirmed by electrical simulation results.

Figure 3:
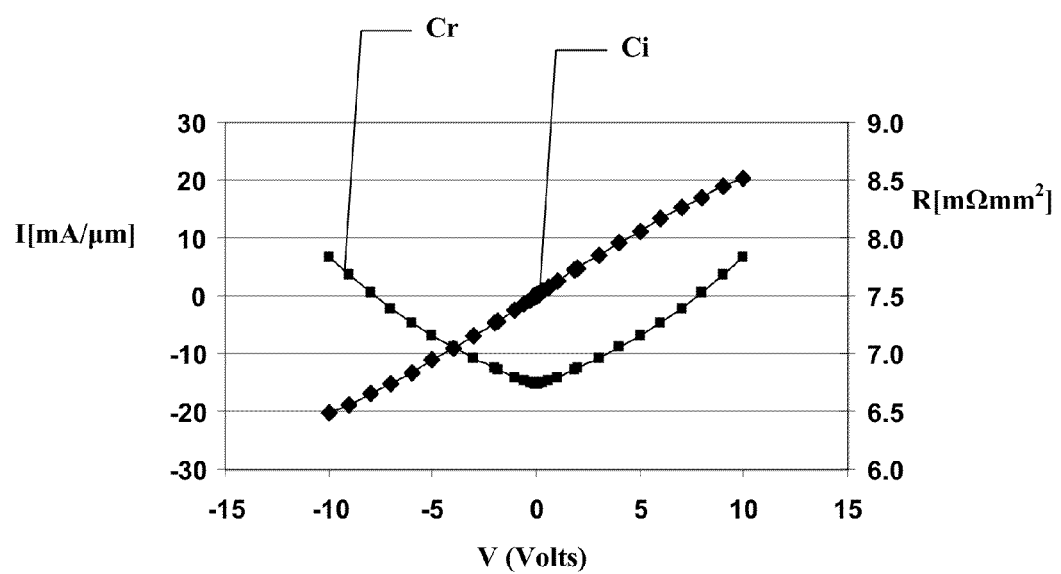
FIG. 3 shows exemplificative diagrams relating to electrical operative parameters of a deep contact according to an embodiment of the present invention.

Particularly, FIG. 3 shows working characteristics of the deep contact according to an embodiment of the present invention when two trenches are formed for contacting the substrate. In particular, the trench depth Td has a value equal to 14 μm, and each trench has a square shape with a side equal to 0.8 μm; the two trenches are spaced apart by 1.2 μm.

The diagram of the FIG. 3 has a current I[mA/μm] on a left axis of ordinates, a resistance R[mΩ*$mm^2$] on a right axis of ordinates and a biasing voltage V[Volts] on an axis of abscissas. Biasing voltages V ranging from −15V to 15V are applied between the deep contact and the substrate, and the corresponding current I is measured (with the resistance R that is calculated as V/I). In detail, the working characteristic Cr represents the resistance and the working characteristic Ci represents the current.

The diagram of the FIG. 3 confirms that the resistance of the deep contact according to an embodiment of present invention has a significantly low value, ranging from 6 mΩ$mm^2$ to 8 mΩ$mm^2$.

Figure 4A:
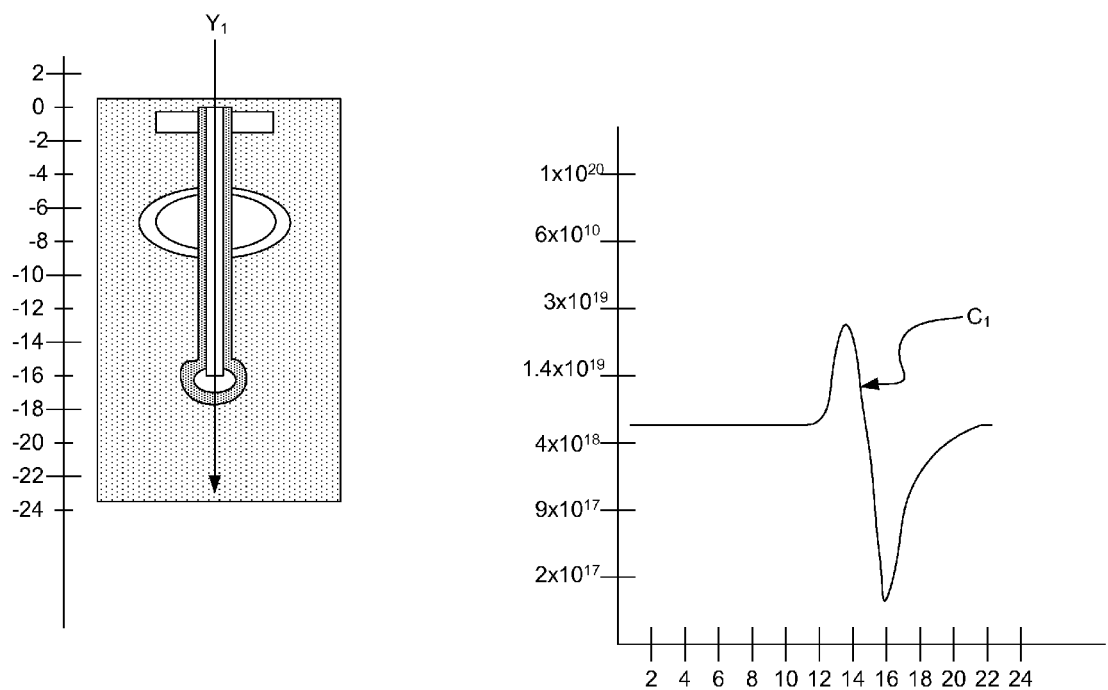
FIGS. 4A and 4B show exemplificative dopant concentration profiles through a deep contact according to an embodiment of the present invention.

FIG. 4A shows an exemplary profile $C_1$ of the dopant concentration of the chip before the activation of the implanted doping impurities along an axis $Y_1$ of a generic filled trench (from the front surface down to the bottom of the substrate). In particular, the diagram of the FIG. 4A has a dopant concentration Da[ions/$cm^3$] on an axis of ordinates and a depth L[μm] (from the front surface) on an axis of abscissas.

The profile $C_1$ is chosen in order to optimize a number of electrical parameters of the deep contact, such as its resistance. The dopant concentration of the conductive material filling the trench (L=0-13 μm) is lower than that in the implanted region (L=13 μm-15 μm) below the trench; more in particular, the dopant concentration of the conductive material is lower of at least one order of magnitude than the dopant concentration of the implanted region. The figure then shows a drop of the dopant concentration below the implanted region and before reaching the substrate (P+); in any case, this drop may be compensated by overdriving the etching of the trench.

Figure 4B:
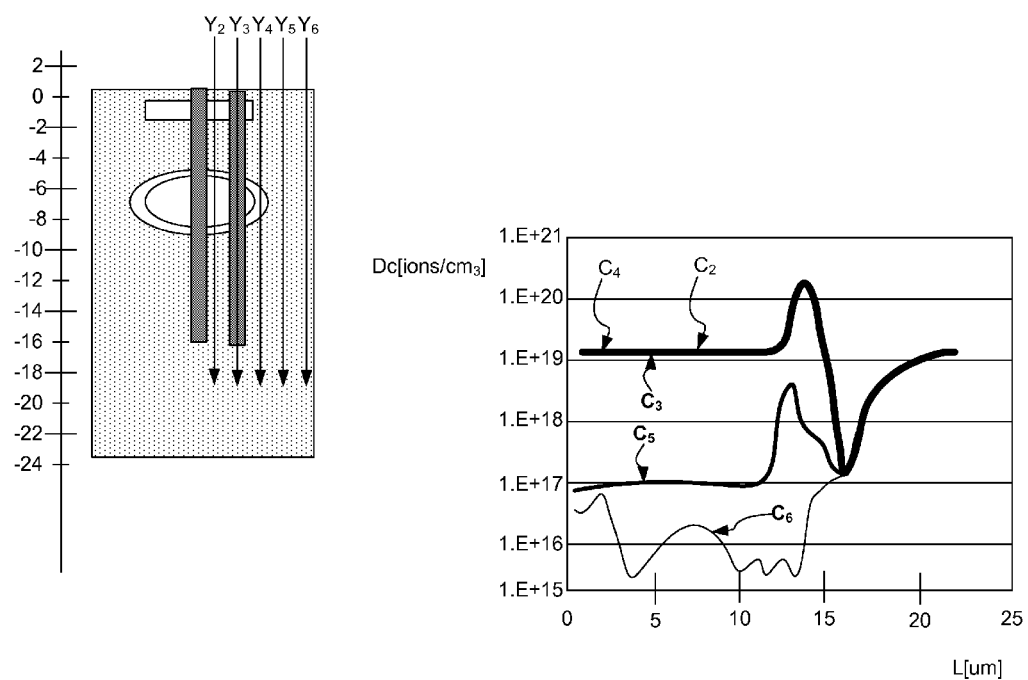

FIG. 4B shows five exemplary dopant concentration profiles $C_2$, $C_3$, $C_4$, $C_5$, $C_6$ after the activation of the doping impurities and at the end of the whole process flow of a chip comprising two filled trenches (with a trench depth Td=13 μm, a trench width I=0.8 μm and a distance s=1.2 μm); the profiles $C_2$, $C_3$, $C_4$, $C_5$, $C_6$ are taken along five axes $Y_2$, $Y_3$, $Y_4$, $Y_5$, $Y_6$, respectively, each one extending from the front surface down to the bottom of the substrate. In particular, the axis $Y_2$ passes from a point in the middle of the two trenches; the axis $Y_3$ passes from a point in the middle of one trench, at a distance approximately equal to 1 μm from the axis $Y_2$. The axes $Y_4$, $Y_5$, $Y_6$ passes from a corresponding point being at a distance approximately equal to 1.4 μm, 2.2 μm, 2.6 μm, respectively, from the axis Y2—so as to result outside the trenches.

In particular, for depths measured from the front surface down to the implanted region (L=0-14 μm), the profiles $C_2$, $C_3$ and $C_4$ show that the dopant concentrations along the axes $Y_2$ and $Y_4$ (in the semiconductor region close to the filled trenches) are approximately of the same order of magnitude as the dopant concentration along the axis $Y_3$ (in the conductive material filling the trenches)—since the implanting process is effective in implanting impurities into regions close to the trenches. The profiles $C_5$ and $C_6$ instead show that the dopant concentrations along the axes $Y_5$ and $Y_6$, respectively (in semiconductor regions far away from the trenches), is lower than that of the profiles $C_2$, $C_3$ and $C_4$, and in particular of at least two (profile $C_5$) and at least three (profile $C_6$) orders of magnitude, respectively. In any case, the dopant concentration of the implanted region below the trenches (L=13 μm-15 μm) is higher; more in particular, the dopant concentration of the implanted region is higher than the dopant concentration of the conductive material filling the trenches of at least one order of magnitude. This difference is the result of the tilt α that is used for the implantation process, wherein the region below the trench receives a full dose of the doping impurities (α=0°)—while the effective dose that is received by the region around the trench is according lowered (α=3° in the example at issue).

For higher depths (L=15 μm-25 μm), the profiles $C_2$, $C_3$, $C_4$, $C_5$, $C_6$ show approximately a same value of the dopant concentration (and in particular lower in the active layer and higher in the substrate).

It should be noted that the dopant concentration outside the trenches falls to the same value of the substrate already at a distance of about 1 μm from them; this confirms that the room taken by the deep contact remains very low for large depths, even with a very high concentration of the doping impurities (and then a very low resistance of the deep contact).

Figure 5:
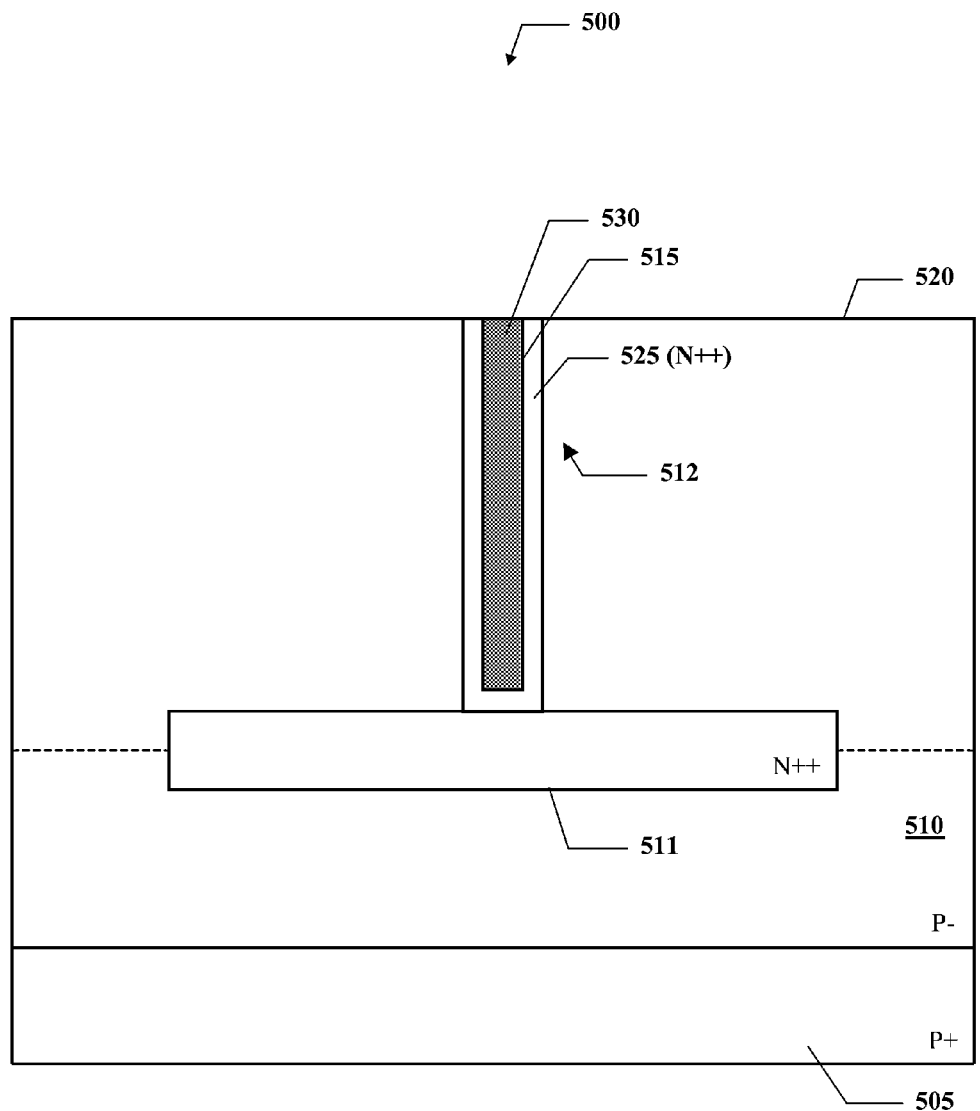
FIG. 5 shows a cross-section view of a schematic structure of an electronic device according to a further embodiment of the present invention.

FIG. 5 shows a cross-section view of an electronic device 500 according to a further embodiment of the present invention. As above, the device 500 (for example, again of the smart power type) is formed in a chip including a semiconductor substrate 505 (for example, of the P+ type) on which an active layer 510 (for example, of the P− type) is staked. A buried layer 511 (for example, of the N++ type) is embedded in the active layer 510; typically, the buried layer 511 is formed between two different epitaxial layers (separated in the figure by means of a dashed line).

A deep contact 512 extends through the active layer 510 down to the buried layer 511; this deep contact 512 is used to collect functional currents that are injected by the electronic components towards the buried layer 511 during their operation. In this case as well, the deep contact 512 is formed by exploiting one or more trenches 515 (only one shown in figure) extending from an exposed (or front) surface 520 (opposite the substrate 505) into the active layer 510. For this purpose, doping impurities are implanted (and then activated) into the chip through at least part of the lateral surfaces of the trench 515 (which is then filled with conductive material 530). As a result, a highly doped contact region 525 (for example, of the N++ type of conductivity) extending from the front surface 520 to the buried layer 511 is obtained. The deep contact 512 so obtained provides the same advantages pointed out above. The deep contact 512 may be formed by a manufacturing process similar to the one described in the foregoing (so that its explanation is omitted for the sake of simplicity).

Figure 6:
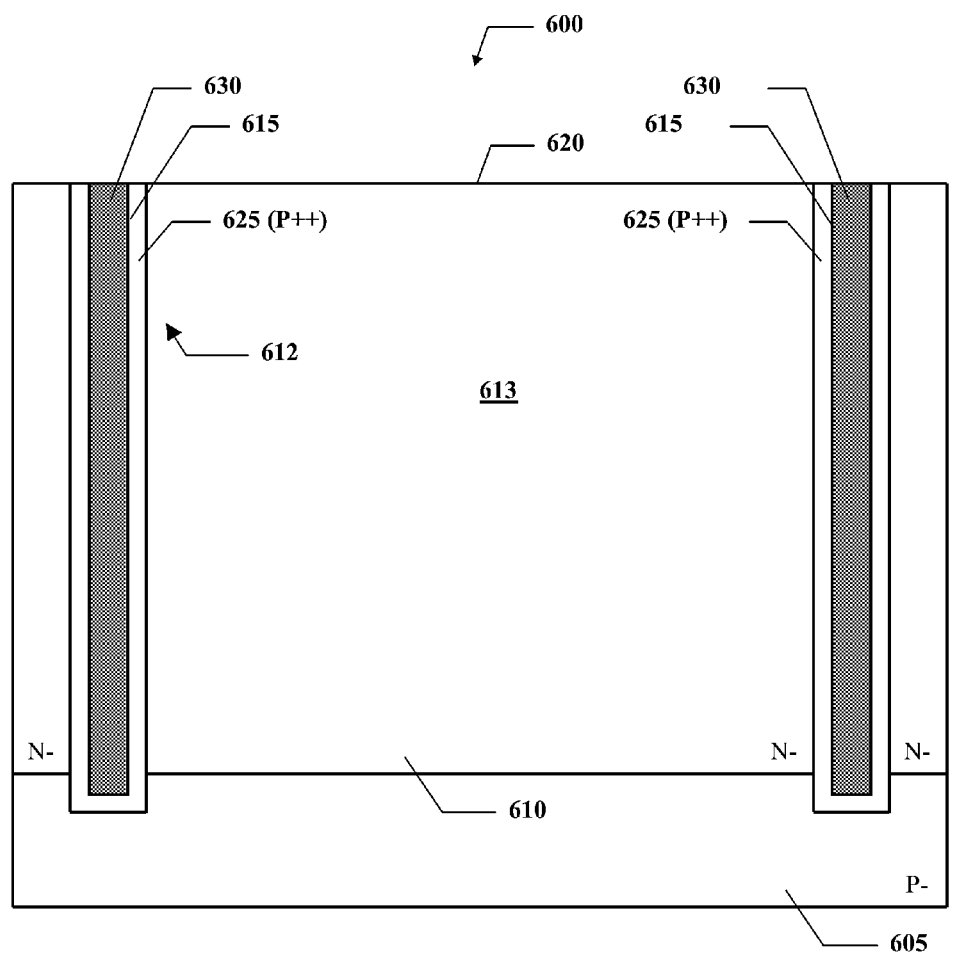
FIG. 6 shows a cross-section view of a schematic structure of an electronic device according to a still further embodiment of the present invention.

FIG. 6 shows a cross-section view of an electronic device 600 according to a still further embodiment of the present invention. In this case, the device 600 (for example, again of the smart power type) is formed in a chip including a semiconductor substrate 605 (for example, of the P− type) on which an active layer 610 of the opposite type of conductivity (for example, of the N− type) is staked.

A deep contact 612 in the form of a frame (for example, ring- or square-shaped) extends through the active layer 610 down to the substrate 605; the substrate 605 and the deep contact 612 form an insulation region 605,612 that separates a well 613 of the active layer 610. As a result, the well 613 may be insulated from the rest of the chip when a P-N junction being formed between the insulation region 605,612 and the well 613 is reverse biased.

In this case as well, the deep contact 612 is formed by exploiting one or more trenches 615 (only one shown in figure) extending from an exposed (or front) surface 620 (opposite the substrate 605) into the active layer 610. For this purpose, doping impurities are implanted (and then activated) into the chip through at least part of the lateral surfaces of the trench 615 (which is then filled with conductive material 630). As a result, a highly doped contact region 625 (for example, of the P++ type of conductivity) extending from the front surface 620 to the substrate 605 is obtained. In this case as well, the deep contact 612 so obtained provides the same advantages pointed out above. The deep contact 612 may be formed by a manufacturing process similar to the one described in the foregoing (so that its explanation is omitted for the sake of simplicity).

As shown in the figure, the trench 615 may be deeper than the thickness of the active layer 610 so as to enter the substrate 605 (for example, by 2-4 μm). This increases the electrical connection between the substrate 605 and the deep contact 612, and minimizes the risk of any punch-through between adjacent wells 613.

Naturally, in order to satisfy local and specific requirements, a person skilled in the art may apply to the solution described above many logical and/or physical modifications and alterations. More specifically, although one or more embodiments of the present invention have been described with a certain degree of particularity, it should be understood that various omissions, substitutions and changes in the form and details as well as other embodiments are possible. Particularly, an embodiment may even be practiced without the specific details (such as the numerical examples) set forth in the preceding description to provide a more thorough understanding thereof; conversely, well-known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

For example, the described process is not to be interpreted in a limitative manner. Particularly, it is possible to use equivalent steps, to remove some steps being not essential, or to add further optional steps; moreover, the masks used during the process may be different in number and in type.

In a different embodiment of the invention, the deep contact may be formed with another number of trenches (down to a single one); moreover, two or more distinct contact regions (each one surrounding one or more trenches) may be formed.

The proposed dimensioning of the trench depth, distance among the trenches and trench width should not be interpreted in a limitative manner; for example, the use of closer trenches is possible.

In an alternative embodiment of the present invention, it is possible to avoid implanting the doping impurities through the bottom surface of the trenches (for example, when they reach the substrate or the buried layer).

In any case, the trenches may be either less deep or deeper than the thickness of the active layer (in every embodiment of the invention).

Moreover, nothing prevents using a different number of implantation processes (down to single one) each one with a beam of doping impurities that forms a different angle with the axes of the trenches; in any case, it is also possible that the doping impurities are not implanted through the whole lateral surfaces of the trenches.

Likewise, the doping impurities may be activated with equivalent techniques (for example, at different temperatures and/or in different periods).

Moreover, the use of trenches with different form ratios is within the scope of the present invention.

Similar considerations apply if the regions of the N-type are replaced by regions of the P-type, and vice-versa. In any case, the numerical examples of the dopant concentrations must not be interpreted in a limitative manner.

Alternatively, each trench may be filled with different conductive materials.

Moreover, nothing prevents forming the interconnection tap on the contact region as well.

More generally, an embodiment may be implemented in whatever electronic device (even not of the power type) that is integrated in a generic chip.

It is possible to activate the doping impurities for the electronic components and the deep contact in different process phases.

Moreover, the reference to the smart power applications is merely illustrative, with the same solution that may be used in whatever application (for example, in a device only including power electronic components).

In any case, the above-described applications of the proposed solution are not exhaustive. For example, it is possible to use the deep contacts for reaching a buried layer that is embedded between the substrate (for example, of the P−type) and the epitaxial layer (for example, of the N type).

Similar considerations apply if the device has an equivalent structure (such as with layers having different thickness or made with other materials). Moreover, the active layer may have either a single layer or a multi-layer structure; likewise, the trenches may have any other shape (for example, with a circular cross-section).

It should be readily apparent that the proposed device may be part of the design of an integrated circuit. The design may also be created in a programming language; moreover, if the designer does not fabricate chips or masks, the design may be transmitted by physical means to others. In any case, the resulting integrated circuit may be distributed by its manufacturer in raw wafer form, as a bare die, or in packages form. Moreover, the device may be integrated with other circuits in the same chip, or it may be mounted in intermediate products (such as mother boards) and coupled to one or more other chips (such as a processor or a memory). In any case, the integrated circuit may be suitable to be used in complex systems (such as computers).

The invention claimed is:

1. A method for manufacturing an integrated electronic device, comprising:
    providing a chip of semiconductor material including a covered layer and an active layer being stacked on the covered layer, the active layer having an exposed surface opposite the covered layer;
    forming a contact element for electrically contacting the covered layer from the exposed surface;
    wherein forming the contact element includes:
        forming at least one trench extending from the exposed surface into the active layer, the at least one trench having a lateral surface and a bottom surface;
        implanting doping impurities into the chip through at least part of the lateral surface of the at least one trench;
        filling the at least one trench with conductive material; and
        activating the implanted doping impurities to obtain at least one contact region extending from the exposed surface through to the covered layer.

2. The method according to claim 1, wherein forming the at least one trench includes:
    forming at least two trenches, the at least one contact region consisting of a single contact region embedding the trenches.

3. The method according to claim 2, wherein a trench width ranges from about 0.2 μm to 2 μm, each pair of adjacent trenches being spaced apart by a distance (s) ranging from about 0.5 μm to 1.5 μm.

4. The method according to claim 1, wherein implanting the doping impurities includes:
    implanting the doping impurities into the chip further through the bottom surface of each trench.

5. The method according to claim 1, wherein each trench has an axis of symmetry being perpendicular to the exposed surface, the step of implanting the doping impurities including:
    applying at least one beam of said doping impurities along a direction forming an angle ($\alpha$) with the axis of symmetry ranging from 0° to the arctg function of a ratio between a trench width and a trench depth.

6. The method according to claim 1, wherein activating the doping impurities includes:
    heating the chip at a temperature ranging from about 950° C. to 1,050° C. for a period ranging from about 30 s to 300 s.

7. The method according to claim 1, wherein a trench depth is higher than a trench width.

8. The method according to claim 7, wherein a form ratio between the trench depth and the trench width ranges from about 2 to 40.

9. The method according to claim 1, wherein a dopant concentration of the conductive material is lower than a dopant concentration of the at least one contact region.

10. The method according to claim 1, wherein filling the at least one trench includes:
filling the at least one trench with polysilicon, and
doping the polysilicon in situ.

11. The method according to claim 1, further including:
forming at least one interconnection tap contacting the at least one filled trench on a free surface thereof.

12. The method according to claim 1, further including:
forming at least one power component in the active layer.

13. The method according to claim 1, wherein the method further includes:
forming a logic circuit in the active layer for controlling the at least one power component.

14. The method according to claim 1, wherein the covered layer is a substrate of the chip, and forming the contact element
includes forming a sinker for collecting an undesired current from the substrate.

15. The method according to claim 1, wherein the covered layer is a substrate of the chip, the forming the contact element including:
forming an insulating region including the contact element and the substrate, the insulating region being adapted to insulate a well of the active layer being separated by the insulating region.

16. A method for manufacturing an integrated electronic device, comprising:
providing a chip of semiconductor material including a covered layer and an active layer being stacked on the covered layer, the active layer having an exposed surface opposite the covered layer;
forming a contact element for electrically contacting the covered layer from the exposed surface;
wherein forming the contact element includes:
forming at least one trench extending from the exposed surface into the active layer, the at least one trench having a lateral surface and a bottom surface;
implanting doping impurities into the chip through at least part of the lateral surface of the at least one trench;
filling the at least one trench with conductive material; and
activating the implanted doping impurities to obtain at least one contact region extending from the exposed surface to the covered layer;
wherein implanting the doping impurities includes:
implanting the doping impurities into the chip further through the bottom surface of each trench; and
wherein forming the at least one trench includes:
forming the at least one trench with a trench depth lower than a thickness of the active layer.

17. A method for manufacturing an integrated electronic device, comprising:
providing a chip of semiconductor material including a covered layer and an active layer being stacked on the covered layer, the active layer having an exposed surface opposite the covered layer;
forming a contact element for electrically contacting the covered layer from the exposed surface;
wherein forming the contact element includes:
forming at least one trench extending from the exposed surface into the active layer, the at least one trench having a lateral surface and a bottom surface;
implanting doping impurities into the chip through at least part of the lateral surface of the at least one trench;
filling the at least one trench with conductive material; and
activating the implanted doping impurities to obtain at least one contact region extending from the exposed surface to the covered layer;
forming at least one power component in the active layer;
implanting further doping impurities selectively into the chip through the exposed surface; and
activating the further doping impurities during the step of activating the doping impurities.

18. A method for manufacturing an integrated electronic device, comprising:
providing a chip of semiconductor material including a covered layer and an active layer being stacked on the covered layer, the active layer having an exposed surface opposite the covered layer;
forming a contact element for electrically contacting the covered layer from the exposed surface;
wherein forming the contact element includes:
forming at least one trench extending from the exposed surface into the active layer, the at least one trench having a lateral surface and a bottom surface;
implanting doping impurities into the chip through at least part of the lateral surface of the at least one trench;
filling the at least one trench with conductive material; and
activating the implanted doping impurities to obtain at least one contact region extending from the exposed surface to the covered layer;
wherein the covered layer is a buried layer being buried within the chip, the step of forming the contact element including:
forming a sinker for collecting a functional current from the buried layer.

19. A method for manufacturing an integrated circuit, comprising:
forming a first layer of semiconductor material covering a second layer of semiconductor material, the first layer having an exposed surface opposite the second layer;
forming a trench extending from the exposed surface to a depth into the second layer, the trench having a lateral surface and a bottom surface;
implanting doping impurities into the first and second layer through at least part of the lateral surface and the bottom surface of the trench;
filling the trench with conductive material; and
activating the implanted doping impurities to obtain a contact region extending from the exposed surface to the covered layer.

20. The method of claim 19, wherein forming the trench further comprises forming a trench having a depth substantially greater than a width of the trench.

* * * * *